United States Patent
Yang et al.

(10) Patent No.: US 6,387,813 B1
(45) Date of Patent: May 14, 2002

(54) METHOD FOR STRIPPING A LOW DIELECTRIC FILM WITH HIGH CARBON CONTENT

(75) Inventors: Neng-Hui Yang; Ming-Sheng Yang, both of Hsinchu; Chih-Chien Liu, Taipei, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/721,147

(22) Filed: Nov. 22, 2000

(30) Foreign Application Priority Data

Oct. 26, 2000 (TW) .......................................... 89122541

(51) Int. Cl.[7] ...................... H01L 21/311; H01L 21/461
(52) U.S. Cl. ........................ 438/699; 438/697; 438/745; 438/756
(58) Field of Search .............................. 438/699, 694, 438/697, 745, 756, 788

(56) References Cited

U.S. PATENT DOCUMENTS 5,811,358 A * 9/1998 Tseng et al. ................ 438/725
6,007,675 A * 12/1999 Toshima ...................... 156/345
6,124,211 A * 9/2000 Butterbaugh et al. ....... 438/708
6,242,368 B1 * 6/2001 Holmer et al. .............. 438/795

* cited by examiner

*Primary Examiner*—Alexander G. Ghyka
(74) *Attorney, Agent, or Firm*—Charles C.H. Wu; Charles C.H. Wu & Associates

(57) ABSTRACT

A method for stripping a low dielectric film with a high carbon content from silicon monitor chip. The silicon monitor chip is placed inside a plasma-enhanced chemical vapor deposition chamber and the surface is treated with oxygen plasma to form a silicon-rich oxide layer. A high-carbon-content low dielectric film is formed over the silicon-rich oxide for film quality inspection. After the film inspection, the silicon monitor chip is immersed in a solution containing ammonium hydroxide and hydrogen peroxide so that the surface of the high-carbon-content dielectric film is transformed from hydrophobic to hydrophilic. Hence, wetting capacity of subsequently applied hydrofluoric acid solution is enhanced. Finally, the silicon monitor chip is immersed in a hydrofluoric acid solution for stripping away the low dielectric film.

9 Claims, 4 Drawing Sheets

| Sample No. | No. of Microparticles Before Oxygen Plasma Treatment (>0.2um) | No. of Microparticles After Oxygen Plasma Treatment (>0.2um) | Thickness of Silicon-rich Oxide Layer (Å) | Thickness Uniformity at 1 Sigma(%) |
|---|---|---|---|---|
| Sample1 | 9 | 8 | 41.26 | 0.98 |
| Sample2 | 4 | 3 | 41.28 | 0.96 |
| Sample3 | 2 | 3 | 41.32 | 0.95 |
| Sample4 | 3 | 4 | 41.5 | 0.91 |
| Sample5 | 2 | 1 | 42.3 | 0.96 |
| Sample6 | 3 | 4 | 41.9 | 0.97 |

FIG. 3

| Sample No. | Oxygen Plasma Treatment | Thickness of Dielectric Layer (Å) | Thickness Uniformity at 1 Sigma (%) | Increase in the No. of Micro-particles (>0.2um) | Carbon Content (%) |
|---|---|---|---|---|---|
| 1 | ✓ | 6125 | 2.53 | 15 | 16.2 |
| 2 | ✗ | 6101 | 2.54 | 13 | 16.3 |
| 3 | ✓ | 6145 | 2.57 | 17 | 16.2 |
| 4 | ✗ | 6110 | 2.49 | 8 | 15.9 |
| 5 | ✓ | 6124 | 2.56 | 12 | 16.2 |
| 6 | ✗ | 6132 | 2.57 | 18 | 15.9 |
| 7 | ✓ | 6128 | 2.49 | 13 | 15.8 |
| 8 | ✗ | 6125 | 2.53 | 5 | 16.1 |
| 9 | ✓ | 6141 | 2.47 | 7 | 15.9 |
| 10 | ✗ | 6111 | 2.59 | 15 | 16.3 |
| 11 | ✓ | 6129 | 2.48 | 3 | 16.4 |
| 12 | ✗ | 6098 | 2.51 | 8 | 15.8 |

FIG. 4

| Sample No. | Oxygen Plasma Treatment | Before Immersion (Å) | After Immersion (Å) |
|---|---|---|---|
| 1 | ✓ | 6125 | Complbtecy Removed |
| 2 | ✗ | 6101 | 185 |
| 3 | ✓ | 6145 | Complbtecy Removed |
| 4 | ✗ | 6110 | 213 |
| 5 | ✓ | 6124 | Complbtecy Removed |
| 6 | ✗ | 6132 | 68 |
| 7 | ✓ | 6128 | Complbtecy Removed |
| 8 | ✗ | 6125 | 129 |
| 9 | ✓ | 6141 | Complbtecy Removed |
| 10 | ✗ | 6111 | 131 |
| 11 | ✓ | 6129 | Complbtecy Removed |
| 12 | ✗ | 6098 | 102 |

FIG. 5

METHOD FOR STRIPPING A LOW DIELECTRIC FILM WITH HIGH CARBON CONTENT

CROSS-REFERENCE TO RELATED APPLICATION

This application claims the priority benefit of Taiwan application serial no. 89122541, filed Oct. 26, 2000.

BACKGROUND OF THE INVENTION

1. Field of Invention

The present invention relates to a method for stripping a dielectric film. More particularly, the present invention relates to a method for stripping a low dielectric film with a high carbon content from a silicon monitor chip.

2. Description of Related Art

Following the rapid increase in the level of integration and complexity of integrated circuits, the formation of a multiple of metallic interconnect layers is unavoidable. As the number of metallic interconnect layers increases, an overall thickness of deposited layers increases correspondingly. Thickness can be reduced by lowering the dielectric constant of the silicon oxide layer. In general, the lower the dielectric constant, the smaller can be the required thickness of the dielectric layer. Therefore, silicon oxide layer has been largely replaced by a high-carbon-content and low dielectric constant (k) film. Utilizing such high-carbon-content low dielectric film, resistance/capacitance (RC) delay due to line width reduction is minimized. However, the high-carbon-content low dielectric film is formed by using different carbon-containing reactive gases in a plasma-enhanced chemical vapor deposition (PECVD).

Quality of the high-carbon-content low dielectric film in a PECVD process must be closely monitored. Monitoring can be achieved by depositing a low dielectric film over a silicon monitor chip and inspecting the deposited dielectric film thereafter. Since the silicon monitor chip can be reused many times, the dielectric film on the silicon monitor chip is stripped off using hydrofluoric acid solution.

However, the high-carbon-content low dielectric film formed by a plasma-enhanced chemical vapor deposition often contains carbon up to 10%. The carbon atoms inside the dielectric film may react with silicon atoms on the surface of the silicon monitor chip to form carbon-silicon bonds. Once such carbon-silicon bonds are formed, hydrofluoric acid solution can hardly break those bonds and strip the dielectric film from the silicon monitor chip. In addition, the dielectric film is hydrophobic (non-polar) while the stripping agent such as hydrofluoric acid is polar. Hence, wetting capacity of the hydrofluoric acid solution with respect to the dielectric film may be lowered leading to a poor stripping. If the dielectric film is not completely removed from the silicon monitor chip, the monitor chip has to be scrapped or returned for regeneration.

FIG. 1 is a flow chart showing conventional steps of using a silicon monitor chip for inspecting a dielectric films starting from the deposition a dielectric film to stripping the dielectric film and the recycling the silicon monitor chip. In general, a high-carbon-content low dielectric film is formed over a control monitor chip in a plasma-enhanced chemical vapor deposition. Quality of the film deposited on the control monitor chip is later inspected before applying a hydrofluoric acid solution to strip off the dielectric film. However, because the deposited dielectric film is a high-carbon-content material, carbon atoms will react with silicon atoms on the silicon monitor chip to form strong carbon-silicon bonds. The carbon-silicon bonds are particularly hard for hydrofluoric acid to break. Ultimately, only a portion of the dielectric film is removed from the silicon monitor chip. Furthermore, the dielectric film is hydrophobic (non-polar) while the stripping agent—the hydrofluoric acid—is polar. Hence, wetting capacity of the hydrofluoric acid solution with respect to the dielectric film is compromised leading to additional difficulties in stripping off the dielectric film.

SUMMARY OF THE INVENTION

Accordingly, one object of the present invention is to provide a method for stripping a high-carbon-content low dielectric film from a silicon monitor chip.

To achieve these and other advantages and in accordance with the purpose of the invention, as embodied and broadly described herein, the invention provides a method for stripping a low dielectric film with a high carbon content from a silicon monitor chip. First, the silicon monitor chip is placed inside a plasma-enhanced chemical vapor deposition chamber and then the surface of the silicon monitor chip is treated with oxygen plasma to form a silicon-rich oxide layer. The silicon-rich oxide layer serves to prevent the formation of bonds between the silicon atoms in the silicon monitor chip and the carbon atoms within the subsequently deposited dielectric film. A high-carbon-content low dielectric film is formed over the silicon-rich oxide for film quality inspection. After the film inspection, the silicon monitor chip is immersed in a solution containing ammonium hydroxide and hydrogen peroxide so that the surface of the dielectric film is transformed from hydrophobic to hydrophilic. Hence, wetting capacity of subsequently applied hydrofluoric acid solution is enhanced. Finally, the silicon monitor chip is immersed in a hydrofluoric acid solution whose concentration is greater than 30% to strip away the low dielectric film.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 3 is a table listing the results of six silicon monitor chip samples with oxygen plasma treatment;

FIG. 4 is a table listing the experimental results of performing a high-carbon-content low dielectric film deposition over the surface of six oxygen-plasma-treated silicon monitor chip samples and six non-treated silicon monitor chip samples; and FIG. 5 is a table listing the final states after the process of stripping the dielectric film from the twelve silicon monitor chip samples by immersing in hydrofluoric acid solution is carried out.

DESCRIPTION OF THE PREFERRED EMBODIMENTS

Figure 1:
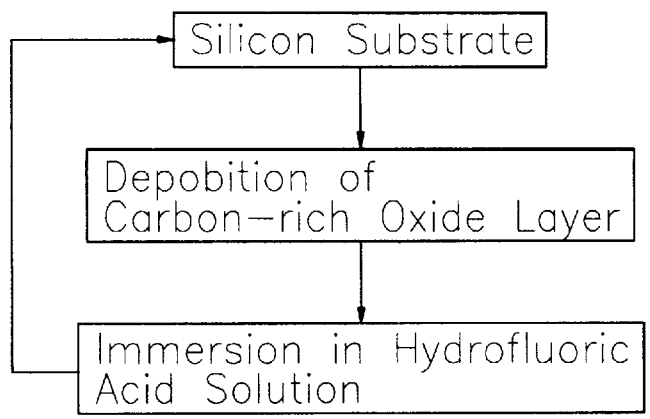
FIG. 1 is a flow chart showing conventional steps of using a silicon monitor chip for inspecting a dielectric films starting from the deposition a dielectric film to stripping the dielectric film and the recycling the silicon monitor chip.

Reference will now be made in detail to the present preferred embodiments of the invention, examples of which are illustrated in the accompanying drawings. Wherever possible, the same reference numbers are used in the drawings and the description to refer to the same or like parts.

Figure 2:
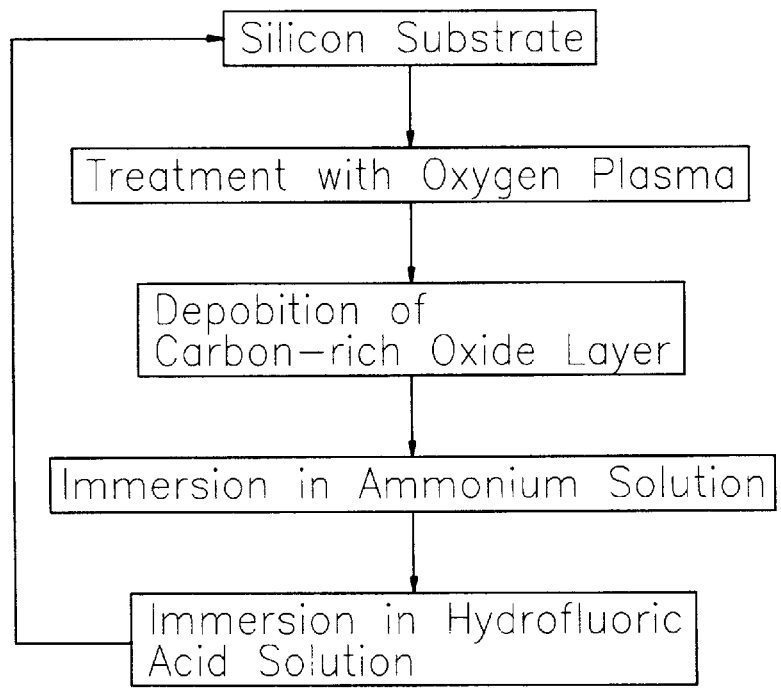
FIG. 2 is a flow chart showing the steps according to this invention of using a silicon monitor chip for inspecting dielectric films starting from the deposition a dielectric film to the stripping the dielectric film and the recycling of the silicon monitor chip.

FIG. 2 is a flow chart showing the steps according to this invention of using a silicon monitor chip for inspecting dielectric films starting from the deposition a dielectric film to the stripping the dielectric film and the recycling of the silicon monitor chip. First, a silicon monitor chip is treated using oxygen plasma to form a silicon-rich oxide layer on the surface of the chip. A high-carbon-content low dielectric layer having a thickness of about 6100 Å is formed over the silicon-rich layer. The high-carbon content low dielectric layer provides parameters for monitoring a deposited dielectric film. The silicon monitor chip is next immersed in a solution containing ammonium hydroxide and hydrogen peroxide so that the surface of the high-carbon-content low dielectric film is converted from hydrophobic to hydrophilic. Lastly, the silicon monitor chip is immersed in a hydrofluoric acid solution to remove the high-carbon-content low dielectric layer so that the silicon monitor chip can be reused.

The method of stripping the high-carbon-content low dielectric film from the silicon monitor chip has two more processing steps compared with a conventional method. The additional steps include treating the surface of a silicon monitor chip with oxygen plasma before depositing a dielectric film and immersing the silicon monitor chip in an ammonium hydroxide/hydrogen peroxide solution thereafter for transforming the high-carbon-content dielectric film from hydrophobic to hydrophilic.

A brand new or recycle silicon monitor chip is placed inside a plasma-enhanced chemical vapor deposition (PECVD) chamber. Oxygen plasma is created inside the reaction chamber to treat the silicon monitor chip so that a high-quality silicon-rich oxide layer is formed. The oxygen plasma preferably has a plasma density of about 0.08 to 0.24 $W/cm^2$, an oxygen flow rate of about 1000 to 3000 sccm, a reaction chamber pressure of about 3 to 5 torr, a reaction chamber temperature of about 300 to 500° C. The aforementioned reaction chamber settings may be adjusted according to processing conditions. The oxygen plasma created through high temperature is bombarded against the hydrogen-oxygen rich native oxide layer attached to the surface of the silicon monitor chip. The dissociated and highly reactive oxygen atoms react uniformly with the clean surface of the silicon monitor chip to form a high-quality silicon oxide layer. The high-quality silicon-rich layer has a thickness of about 42 Å, for example. The silicon-rich layer serves as a barrier preventing carbon atoms from diffusing into the surface of the silicon monitor chip and reacting with the silicon atom to form a difficult-to-strip carbon-silicide layer.

FIG. 3 is a table listing the results of six silicon monitor chip samples with oxygen plasma treatment. After the oxygen plasma treatment, a silicon-rich layer having a thickness of about 42 Å is formed on the surface of the silicon monitor chip, wherein the thickness has an uniformity of less than 1%, preferably between 0.91% to 0.98%. Moreover, the number of micro-particles with diameters greater than 0.2 $\mu m$ is almost identical both before and after the oxygen plasma treatment.

FIG. 4 is a table listing the experimental results of performing a high-carbon-content low dielectric film deposition over the surface of six oxygen-plasma-treated silicon monitor chip samples and six non-treated silicon monitor chip samples. According to table 4, whether the silicon monitor chip is oxygen-plasma-treated or not has little effect on the deposition of a dielectric film. Thickness, uniformity, carbon content and number of micro-particles reveal very little differences. On average, the high-carbon-content low dielectric film has a thickness of about 6100 Å, a thickness uniformity of about 2.5% and the increase in the number of micro-particles from 3 to 18, carbon content of around 16%. Hence, the overall differences are still within acceptable limits.

After inspection of the twelve silicon monitor chip samples, the high-carbon-content low dielectric film must be completely stripped. Before removing the high-carbon-content low dielectric film, the silicon monitor chip is first immersed into a tank filled with a solution containing ammonium hydroxide: hydrogen peroxide: water in the ratio 1:4:20 for 3 to 4 minutes. The solution converts the dielectric film on the silicon monitor chip from hydrophobic to hydrophilic. The conversion facilitates the subsequent removal of the dielectric film. The volumetric ratio between ammonium hydroxide and hydrogen peroxide can be bigger than ¼.

FIG. 5 is a table listing the final states of the twelve silicon monitor chip samples after the dielectric film is stripped therefrom by immersing in hydrofluoric acid solution. In general, the deposited dielectric film over the silicon monitor chip can be removed by immersing the chip in a tank of acid solution for about 2 to 3 minutes. The acid solution, for example, can be a hydrofluoric acid solution having a concentration of 49%. This concentrated hydrofluoric acid solution can provide an etching rate of greater than 5000 Å/min. The twelve silicon monitor chip samples are next rinsed and baked dry. After rinsing and drying, the oxygen-plasma-treated samples contain no trace of residual dielectric film. On the other hand, all the non-treated samples contain a residual dielectric film having a thickness that varies from about 102 Å to 213 Å. The carbon content of such residual dielectric film is much higher than the original carbon content. Moreover, prolonged immersion of the silicon monitor chip in the acid solution will not help to rid the chip of the residual dielectric film a little bit more.

The residual dielectric film is rich in carbon and contains many carbon-silicon bonds. Such a material composition is resistant to hydrofluoric acid solution. Therefore, the silicon monitor chip is first treated with oxygen plasma to form a high-quality silicon-rich oxide layer before depositing the high-carbon-content low dielectric film. In this way, carbon atoms in the dielectric film is prevented from migrating into the silicon monitor chip and form strong carbon-silicon bonds there.

To facilitate the removal of the dielectric film from the silicon monitor chip, the chip is immerse in a solution containing ammonium hydroxide and hydrogen peroxide to convert the surface of the dielectric film from hydrophobic to hydrophilic. Hence, wetting capacity of subsequently applied hydrofluoric acid solution is increased and the effectiveness of film stripping is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for stripping a low dielectric film with a high carbon content, comprising the steps of:
   providing a silicon monitor chip;
   treating the silicon monitor chip with oxygen plasma to form a silicon-rich oxide layer on the surface of the silicon monitor chip;
   forming a low dielectric film with a high carbon content over the silicon rich oxide layer;
   transforming the hydrophobic low dielectric film surface into a hydrophilic surface; and
   immersing the silicon monitor chip in a hydrofluoric acid solution for stripping the low dielectric film.

2. The stripping method of claim 1, wherein the step of transforming the surface of the dielectric film from hydrophobic to hydrophilic includes immersing the silicon monitor chip in a solution containing ammonium hydroxide and hydrogen peroxide.

3. The stripping method of claim 2, wherein the ratio between ammonium hydroxide, hydrogen peroxide and water by volume is 1:4:20.

4. The stripping method of claim 1, wherein the hydrofluoric acid solution has a concentration of hydrofluoric acid greater than 30%.

5. A method for stripping a low dielectric film with a high carbon content, comprising the steps of:
   providing a silicon monitor chip;
   forming a silicon-rich oxide layer over the silicon monitor chip;
   forming a low dielectric film with a high carbon content over the silicon-rich oxide layer;
   transforming the surface of the low dielectric film from hydrophobic to hydrophilic; and
   immersing the silicon monitor chip in a hydrofluoric acid solution to strip the low dielectric film.

6. The stripping method of claim 5, wherein the step of transforming the surface of the dielectric film from hydrophobic to hydrophilic includes immersing the silicon monitor chip in a solution containing ammonium hydroxide and hydrogen peroxide.

7. The stripping method of claim 6, wherein the ratio between ammonium hydroxide, hydrogen peroxide and water by volume is 1:4:20.

8. The stripping method of claim 5, wherein the hydrofluoric acid solution has a concentration of hydrofluoric acid greater than 30%.

9. The stripping method of claim 5, wherein the step of forming the silicon-rich oxide layer includes bombarding the surface of the silicon monitor chip with oxygen plasma to form a uniform oxide layer.

* * * * *